(12) United States Patent
Beers et al.

(10) Patent No.: US 10,843,228 B2
(45) Date of Patent: Nov. 24, 2020

(54) ULTRASOUND TRANSDUCER ARRAY INTERCONNECT

(71) Applicant: Sound Technology Inc., State College, PA (US)

(72) Inventors: Christopher Beers, Boalsburg, PA (US); Michael Berkheimer, Altoona, PA (US); Joseph Conklin, Pleasant Gap, PA (US); Russell Woods, Lewistown, PA (US)

(73) Assignee: Sound Technology Inc., State College, PA (US)

( * ) Notice: Subject to any disclaimer, the term of this patent is extended or adjusted under 35 U.S.C. 154(b) by 159 days.

(21) Appl. No.: 16/070,842

(22) PCT Filed: Jan. 19, 2016

(86) PCT No.: PCT/US2016/013888
§ 371 (c)(1),
(2) Date: Jul. 18, 2018

(87) PCT Pub. No.: WO2017/127050
PCT Pub. Date: Jul. 27, 2017

(65) Prior Publication Data
US 2019/0022699 A1   Jan. 24, 2019

(51) Int. Cl.
*B06B 1/06* (2006.01)
*H01L 41/047* (2006.01)
(Continued)

(52) U.S. Cl.
CPC .......... *B06B 1/0292* (2013.01); *B06B 1/0629* (2013.01); *H01L 41/0471* (2013.01);
(Continued)

(58) Field of Classification Search
CPC .............. H01L 41/083; H01L 41/0472; H01L 41/0471; B06B 1/0292; B06B 1/0629; H05K 1/0393
(Continued)

(56) References Cited

U.S. PATENT DOCUMENTS 4,543,829 A * 10/1985 Lerch .................. G01S 15/8918
  73/626
5,563,346 A * 10/1996 Bartelt ................ G01S 15/8925
  600/447
(Continued)

FOREIGN PATENT DOCUMENTS

EP   2289419 A1   3/2011
EP   2684617 A1   1/2014

OTHER PUBLICATIONS

International Search Report for PCT/IB2016/013888 published as WO2017/127050 dated Jul. 27, 2017.

*Primary Examiner* — Jacques M Saint Surin
(74) *Attorney, Agent, or Firm* — Anthony M. Del Zoppo, III; Daugherty & Del Zoppo Co., LPA

(57) ABSTRACT

An apparatus (100) comprises a probe (102) including a transducer array (108) with a plurality of elements (110), a communications interface (112), and an interconnect (114) configured to route electrical signals between the plurality of elements and the communications interface. The interconnect includes a flexible printed circuit with a first surface with a first metal layer (406, 1210₁), a second opposing surface with a second metal layer (408, 1210₂), a first end (432, 1305), and a second opposing end (434, 1307). The apparatus further includes traces (430, 440, 1304, 1306, 1502, 1804) configured to readout signals from at least one of the first and second opposing ends.

18 Claims, 9 Drawing Sheets

(51) Int. Cl.
*H01L 41/083* (2006.01)
*H05K 1/03* (2006.01)
*B06B 1/02* (2006.01)

(52) U.S. Cl.
CPC ........ *H01L 41/0472* (2013.01); *H01L 41/083* (2013.01); *H05K 1/0393* (2013.01)

(58) Field of Classification Search
USPC .......................................................... 73/632
See application file for complete search history.

(56) References Cited

U.S. PATENT DOCUMENTS

| | | | |
|---|---|---|---|
| 5,617,865 A | 4/1997 | Palczewska | |
| 5,651,365 A | 7/1997 | Hanafy et al. | |
| 6,522,051 B1 | 2/2003 | Nguyen | |
| 6,971,148 B2 | 12/2005 | Mohr et al. | |
| 7,249,513 B1* | 7/2007 | Zipparo | B06B 1/0622 310/336 |
| 7,331,234 B2* | 2/2008 | Tsujita | G01N 29/0609 600/437 |
| 8,176,787 B2* | 5/2012 | Haider | A61B 8/00 600/459 |
| 2002/0129477 A1 | 9/2002 | Bureau | |
| 2004/0168517 A1* | 9/2004 | Dufait | B06B 1/0622 73/626 |
| 2004/0187582 A1* | 9/2004 | Satoh | G01S 7/52047 73/606 |
| 2006/0173343 A1 | 8/2006 | Guo | |
| 2007/0157732 A1* | 7/2007 | Lee | B06B 1/0629 73/634 |
| 2008/0178677 A1* | 7/2008 | Baumgartner | A61B 8/00 73/606 |
| 2010/0063399 A1* | 3/2010 | Walker | G01N 29/0654 600/459 |
| 2010/0154547 A1* | 6/2010 | Fukada | B06B 1/0292 73/632 |
| 2013/0257226 A1* | 10/2013 | Nobles | B06B 1/0622 310/327 |
| 2019/0176293 A1* | 6/2019 | Siebert | B24D 15/02 |

* cited by examiner

ULTRASOUND TRANSDUCER ARRAY INTERCONNECT

RELATED APPLICATION

This application is a national filing of PCT application Serial No. PCT/US2016/013888, filed Jan. 19, 2016, published as WO2017/127050 A1 on Jul. 27, 2017. This application claims priority to PCT application Serial No. PCT/US2016/013888, published as WO2017/127050 on Jul. 27, 2017.

TECHNICAL FIELD

The following generally relates to an ultrasound transducer array and more particularly to an electrical interconnect for a transducer array, and is described with particular application to ultrasound imaging, but is amenable to other ultrasound applications.

BACKGROUND

Two-dimensional (2-D) ultrasound imaging is limited in its ability to reveal three-dimensional (3-D) anatomy. Three-dimensional imaging improves qualitative and quantitative characterization relative to 2-D imaging, but comes with the cost of increased complexity in the transducer, imaging algorithms, data processing, display, etc. Three-dimensional imaging can be accomplished through a linear (1-D) transducer array that is swept mechanically across an area or a matrix (2-D) array that is used with electronic steering.

A 1-D transducer array is limited by the mechanical sweep speed. A 2-D array uses electronic sweeping, which enables faster and more flexible imaging techniques. Ideally, all elements in the matrix are used independently for transmitting and receiving. For a square array with N elements along each edge, this requires N*N electrical connections, which can be challenging to manage from manufacturability, ergonomics, signal integrity, and data analysis perspectives. Further, the electrical characteristics of each small element become difficult to match efficiently to a transmitter and receiver.

Row-column addressing is an alternative approach to 2-D arrays that reduces channel count (2*N instead of N*N) and improves electrical match (at the cost of imaging flexibility). In this approach, electrodes on one surface of the active layer tie together all matrix elements along each row, and electrodes on the opposite surface tie together the elements along each column. This array can be used to transmit in one direction and receive in the orthogonal direction. The literature has discussed both piezoelectric (PZT) and capacitive micromachined ultrasonic transducers (CMUT) based row-column array configurations.

An interconnect circuit electrically connects the elements of the transducer array to electronics on printed circuit boards (PCBs) in the handle of the probe. Unfortunately, interconnects for CMUT row-column arrays include large, rigid PCBs, which are not suitable for commercial medical ultrasound probes, at least since their large size would make the probe ergonomically infeasible. Furthermore, it is challenging to manage the row and column connections in a way that facilitates manufacturability.

With PZT row-column arrays, electrodes patterned on both surfaces of a piezoelectric layer render the electrical interconnect complex. One approach is to solder wires to both surfaces. Unfortunately, this is inconvenient at least because of the way the piezoelectric layer needs to be supported underneath the soldering point. Another approach is to bond a circuit onto both sides of the active layer. Unfortunately, the circuit covering the piezoelectric patient-facing surface would cause significant acoustic performance compromises.

Ultrasound imaging systems can leverage multi-row transducer arrays to improve image quality. Older one-dimensional arrays have a single row of transducer elements in the azimuth direction. In multi-row arrays, however, several parallel one-dimensional arrays are aligned in the elevation direction, where each parallel array constitutes a row of the total array. By operating the rows independently, the acoustic field can be controlled more precisely, which enables image quality improvement. In specific, the multiple rows can be used to make the elevation slice thickness consistent through a long depth range.

However, the fabrication of such devices is considerably more complicated. In 1-D arrays, small wires can be attached to each element along the middle, one end or both ends of the element. In each case, there is only one row of wires to manage. Another approach bonds a circuit behind the active layer. If the former approach were extended to a multi-row array, multiple rows of wires would also be required, and it would be difficult and time-consuming to manage all the wires without allowing them to short to each other. If the latter approach were extended to a multi-row array, it would be difficult to connect independently to each row of the array without contacting the other rows.

SUMMARY

Aspects of the application address the above matters, and others.

In one aspect, an apparatus comprises a probe including a transducer array with a plurality of elements, a communications interface, and an interconnect configured to route electrical signals between the plurality of elements and the communications interface. The interconnect includes a flexible printed circuit with a first surface with a first metal layer, a second opposing surface with a second metal layer, a first end, and a second opposing end. The apparatus further includes traces configured to readout signals from at least one of the first and second opposing ends.

In another aspect, an ultrasound imaging system includes a probe with a single flexible printed circuit configured to route electrical signals between elements of a transducer array of the probe and a communications interface of the probe, wherein the single flexible printed circuit includes two metal layers and route signals off the single flexible printed circuit at opposing ends of the single flexible printed circuit. The ultrasound imaging system further includes an ultrasound device with a transmit circuit that controls transmission by the transducer array, a receive circuit that controls reception by the transducer array, and an echo processor that processes echoes receive by the transducer array. The ultrasound imaging system further includes a complementary communications interface electrically connecting the communications interface of the probe and the ultrasound device.

In another aspect, a method includes transmitting an ultrasound signal with a transducer array of an ultrasound imaging probe. The transducer array includes one of a 2-D row-column addressed capacitive micromachined ultrasonic transducer array, a 2-D row-column addressed piezoelectric transducer array, or a multi-row transducer array. The method further includes receiving echoes with the transducer array. The method further includes generating signals indicative of the received echoes with the transducer array. The method further includes routing the signals from the transducer array to a communications interface of the probe with an interconnect, wherein the interconnect includes a single flexible printed circuit with no more than two metal layers and configured to route the signals at no more than two opposing ends of the single flexible printed circuit. The method further includes processing the signals, generating data indicative thereof.

Those skilled in the art will recognize still other aspects of the present application upon reading and understanding the attached description.

BRIEF DESCRIPTION OF THE DRAWINGS

The application is illustrated by way of example and not limitation in the figures of the accompanying drawings, in which like references indicate similar elements and in which.

DETAILED DESCRIPTION

Figure 1:
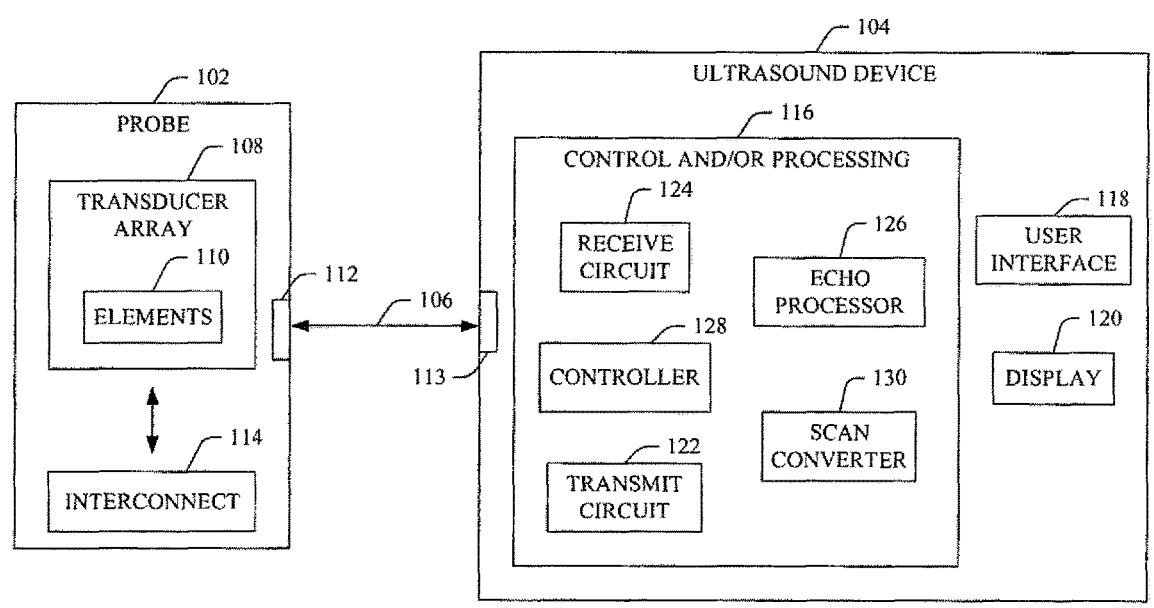
FIG. 1 schematically illustrates an example ultrasound system with a transducer array electrically coupled to a single flexible printed circuit interconnect that has two metal layers located on opposing sides that route signals in opposing directions.

FIG. 1 schematically illustrates an ultrasound (US) system 100. The ultrasound system 100 includes a probe 102 and an ultrasound device 104. Data and/or control signals are conveyed between the probe 102 and the ultrasound device 104 via a communication channel 106 such as a cable, radio frequency, etc. For example, in one instance the probe 102 and the ultrasound device 104 have complementary communications interfaces 112 and 113, and communicate with each other, over a hard wire and/or wirelessly, via the communication channel 106 and the complementary communications interfaces 112 and 113.

The probe 102 includes a transducer array 108 that includes a plurality of transducer elements 110 and an interconnect 114 which electrically connects the plurality of transducer elements 110 and the complementary communications interface 112. In one non-limiting instance, the transducer array 108 is a 2-D row-addressed CMUT or PZT transducer array. In another instance, the transducer array 108 is a multi-row transducer array. In both instance, the interconnect 114 includes a single flexible printed circuit with only two metal layers. As described in greater detail below, traces of the single flexible printed circuit are in both of the two metal layers, which are located on opposing sides of the single flexible printed circuit, and readout signals from opposing ends of the single flexible printed circuit. It is to be appreciated that the trace patterning approaches described herein facilitate maintaining performance and/or manufacturability, and/or provides efficient and/or cost-effective fabrication. In general, the approached described herein may allow for using as few metal layers as possible while managing traces to optimize manufacturing and minimize cost and maintain acoustic performance.

The ultrasound device 104 includes a control and/or processing portion 116, a user interface 118, and a display 120. The control and/or processing portion 116 includes transmit circuitry 122 that controls excitation of the elements 110 and receive circuitry 124 that controls reception of echo signals by the elements 110. The control and/or processing portion 116 further includes an echo processor 126 that processes received echo signals. Such processing may include beamforming (e.g., delay and sum, etc.) and/or otherwise processing the echo signals, e.g., to lower speckle, to improve specular reflector delineation, to filter the echo signals via FIR and/or IIR filters, etc.

The control and/or processing portion 116 further includes a controller 128 that controls the transmit circuitry 122, the receive circuitry 124, and the echo processor 126. Such control may include controlling the frame rate, transmit angles, energies and/or frequencies, transmit and/or receive delays, processing of echo signals, the imaging mode, etc. The control and/or processing portion 116 further includes a scan converter 130 that coverts processed echo signals and generates data for display. The display 120 visually presents the scan converted data, and the user interface 118 includes input controls and/or output displays for interacting with the system 100.

In the illustrated embodiment, the probe 102 and the ultrasound device 104 are separate entities. The probe 102 includes structure which houses the transducer array 108 and the interconnect 114. This may include physically supporting and/or enclosing one or more of the transducer array 108 and the interconnect 114. The ultrasound device 104 includes structure which houses at least the transmit circuitry 122, the receive circuitry 124, the processor 126, the controller 128 and the scan converter 130. In one instance, the ultrasound device 104 is a computer or computing system. The user interface 118 and/or the display 120 can be part of the ultrasound device 104 (as shown) or separate entities connected thereto.

Alternatively, the probe 102 and the ultrasound device 104 are part of a same physical structure such as a single enclosure or housing. Such a configuration may be part of a hand-held or other ultrasound apparatus. A hand-held ultrasound apparatus may utilize internally located power, e.g., from a power source such as a battery, a capacitor, etc. to power the components therein, and/or power from an external power source. An example of a hand-held device is described in U.S. Pat. No. 7,699,776, entitled "Intuitive Ultrasonic Imaging System and Related Method Thereof," and filed on Mar. 6, 2003, which is incorporated herein in its entirety by reference.

FIGS. 2-5 schematically illustrate an example in which the transducer array 108 includes a row-column addressed CMUT chip 402 and the interconnect 114 includes a single flexible printed circuit 404 with a top side 406 and a bottom side 408 and only two metal layers with readout signals from opposing ends. In this embodiment, both the rows and the columns are addressed from a same side (i.e. the top side 406) of the row-column addressed CMUT chip 402.

Figure 2:
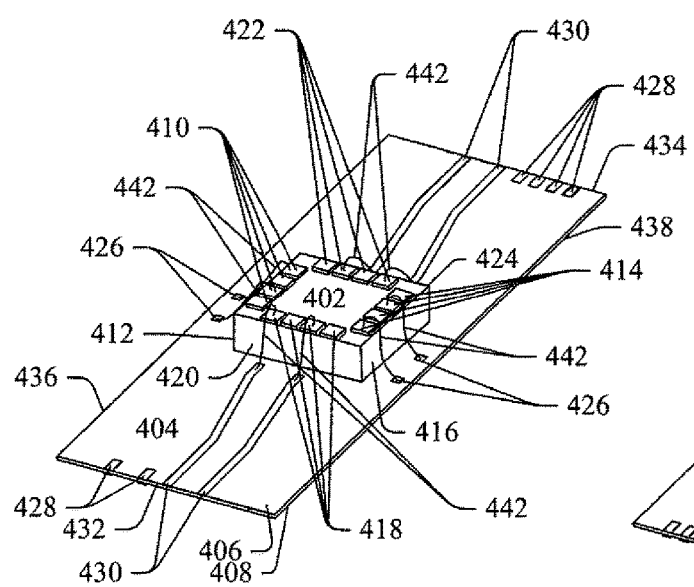
FIGS. 2, 3, 4 and 5 schematically illustrate an example in which the transducer array is a row-column addressed CMUT based transducer array.
Figure 3:
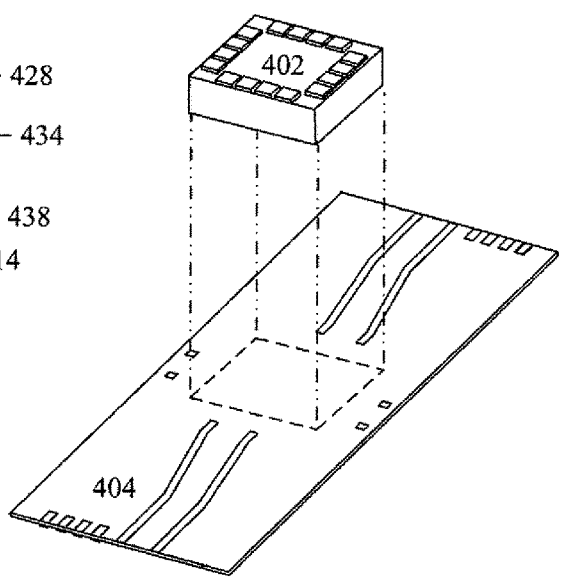
Figure 4:
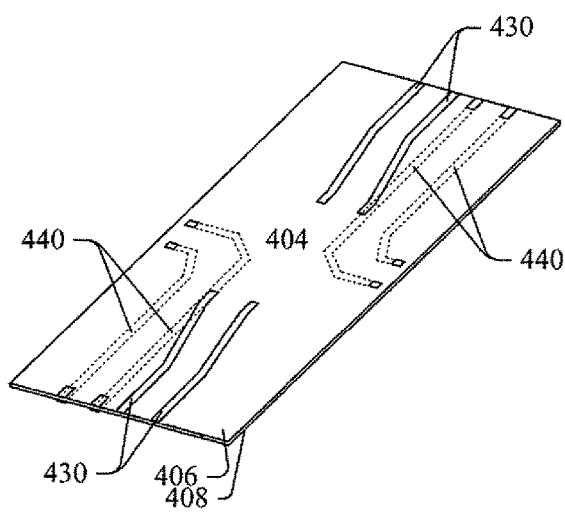
Figure 5:
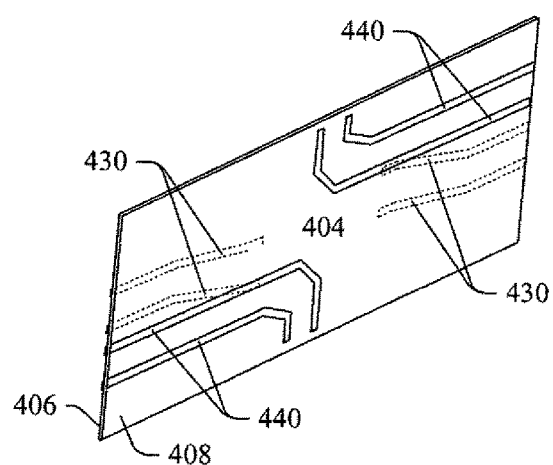

FIG. 2 shows a perspective view looking onto the top side 406 with an installed CMUT chip 402. FIG. 3 shows a perspective view looking onto the top side 406 with the chip 402 separated therefrom. FIG. 4 shows a perspective view looking onto the top side 406 without the chip 402 and with traces on the bottom side 408 the location thereof visible through the top side 406. FIG. 5 shows a perspective view looking onto the bottom side 408 without the chip 402 and with traces on the top side 406 the location thereof visible through the bottom side 408.

For sake of brevity and clarity, the illustrated row-column addressed CMUT chip 402 is discussed in connection with four columns and four rows (i.e., a 4×4 square matrix). However, it is to be understood that the row-column addressed CMUT chip 402 could include 8×8, 16×16, 32×32, 192×192, 512×512, etc. rows and columns, and/or have a non-square configuration such as a rectangular, circular and/or other shaped configuration. An example geometry for a 62×62 square matrix configured for an abdominal scan can be one inch by one inch. Other geometries and applications are contemplated herein.

The illustrated row-column addressed CMUT chip 402 includes a plurality of electrodes along each of the edges with a total of sixteen electrodes, including four on each edge, with electrodes 410 on a first side or edge 412, electrodes 414 on a second side or edge 416 which opposes the first side 412, electrodes 418 on a third side or edge 420 which is transverse and adjacent to and between the first and second sides 412 and 416, and electrodes 422 on a fourth side or edge 424 which opposes the third side 420.

The top side 406 includes a metal layer with a plurality of pads 426, 428 and traces 430. The pads 426 are disposed adjacent to the electrodes 410 and 414 on sides 436 and 438 of the interconnect 114. The traces 430 extend from adjacent to the third and fourth sides 420 and 424 of the chip 402 to ends or sides 432 and 434 of the interconnect 114. A sub-set of the pads 428 are disposed adjacent to the traces at the end 432, and another sub-set of the pads 428 are disposed adjacent to the traces at the end 434.

The bottom side 408 includes a second metal layer with a plurality of traces 440 that extend from the pads 426 of the top side 406 along the second side 408 to the pads 428 on the top side 406. A sub-set of the traces 430 extends to the end 432, and another sub-set of the traces 430 extends to the end 434. The traces 440 electrically connect to the pads 426 and the pads 428 on the top side 406 through vias and/or the like. Signals are read out from only the two opposing sides 432 and 434 via the pads 428 and the traces 430.

Discrete electrically conductive wires 442 are bonded to the CMUT chip electrodes 410, 414, 418 and 422 and the corresponding electrode pads 426 and/or traces 430 on the first side 406 of the flexible printed circuit 404. In the illustrated embodiment, the discrete electrically conductive wires 442 are staggered odd/even between opposing sides for both the rows and the columns. This may ease manufacturability and/or reduce cross-talk. The wires 442 can be soldered, wire-bonded, etc.

Organizing electrical connections (e.g., the traces 430 and 440) as described herein can facilitate assembly and/or enable ergonomics, e.g., by the use of only two legs of the flexible circuit (i.e., ends 432 and 434) that extend from opposite (non-adjacent) edges of the array. The single flexible printed circuit 404 connects to the active transducer material and employs a unique routing technique, which can minimize the number of circuit layers required to connect each row and column of the array.

In general, the single flexible printed circuit 404 is not configured for only the specific row-column addressed CMUT chip 402. Rather, the single flexible printed circuit 404 is compatible with any row-column addressed CMUT chip where the electrical connection pads are on the patient surface of the row-column addressed CMUT chip, regardless of whether the CMUT is fabricated with sacrificial release, wafer bonding, or some other technique.

In a variation, the signals are read out from only one side (e.g., the side 432 or the side 434). This can be achieved by having all of the traces 430 and 440 extend from adjacent to a respective side of the chip 402 to only the edge 432 or 434. In another variation, signals are read out from adjacent sides 432 and 436 or 438, or 434 and 436 and/or 438. In yet another variation, signals can be read out from three or all four of the sides 432, 434, 436 and/or 438. In another still variation, the interconnect 114 includes two or more flexible printed circuit and/or three or more metal layers per flexible printed circuit.

Figure 6:
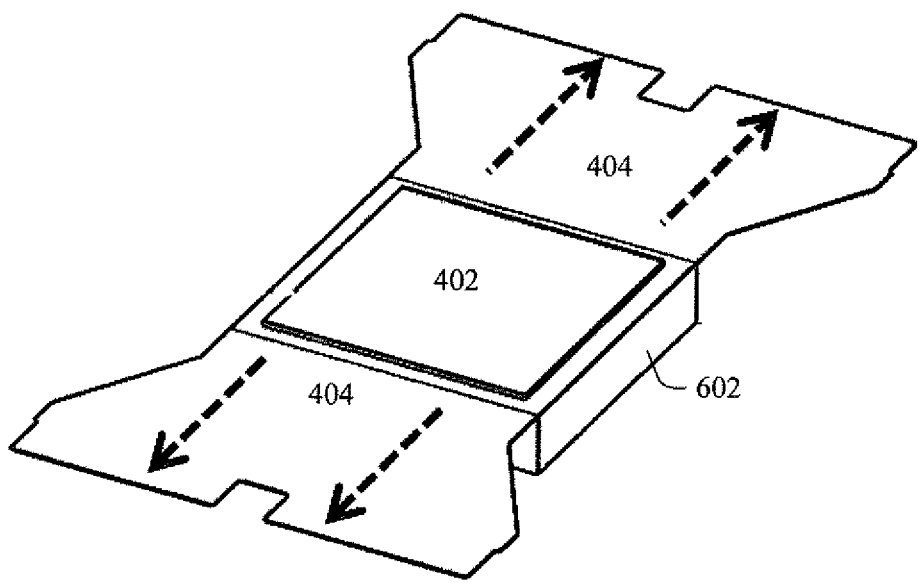
FIGS. 6 and 7 schematically illustrate an example in which the single flexible printed circuit interconnect is folded back behind the CMUT transducer array.
Figure 7:
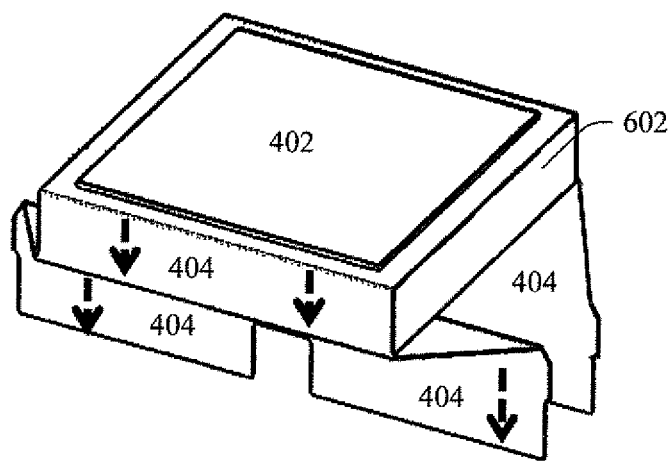
Figure 8:
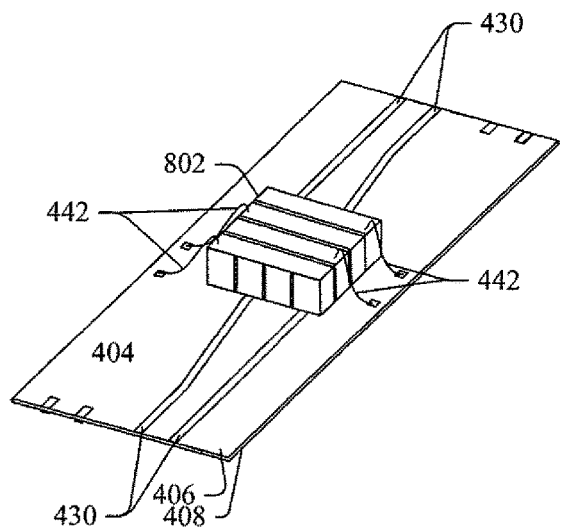
FIGS. 8-11 schematically illustrate an example in which the transducer array is a row-column addressed PZT based transducer array.
Figure 9:
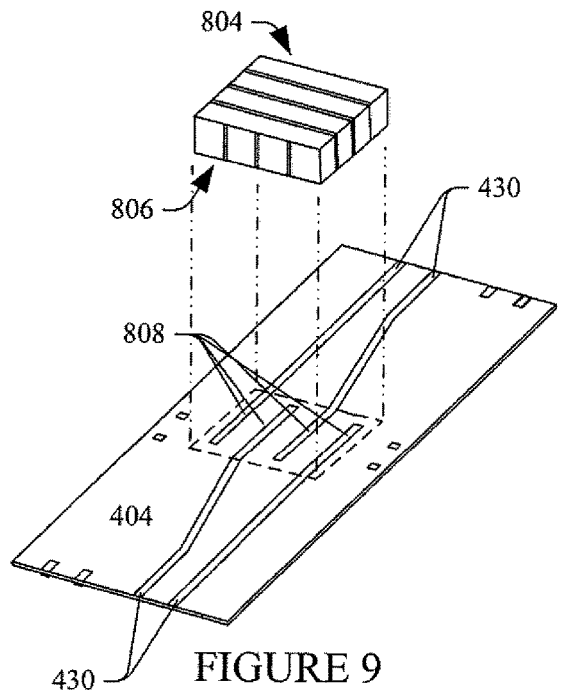
Figure 10:
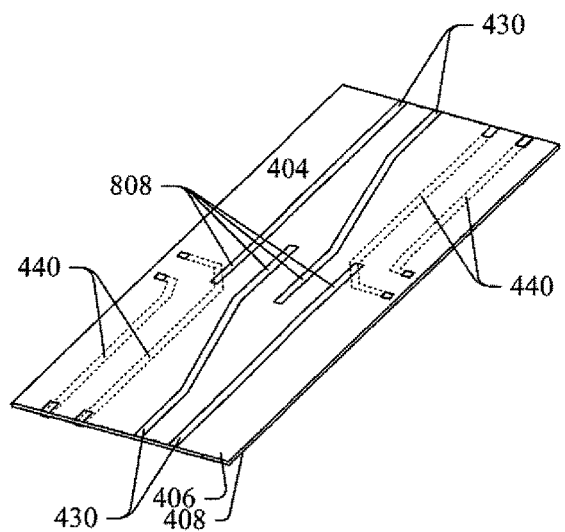

FIGS. 6 and 7 show an example where the single flexible printed circuit 404 is flexed such that the signal traces 430 and 440 (indicated by dashed lines with arrow heads) are redirected back behind the row-column addressed CMUT chip 402 by bending the single flexible printed circuit 404. A rigid piece of stiffener material 602 (e.g., FR-4) can be placed on the bottom side 406 of the single flexible printed circuit 404 under the row-column addressed CMUT chip 402 to provide stability, e.g., during chip mounting and/or otherwise.

A larger backing block can be bonded to the back side of the stiffener. Due to the operation of the row-column addressed CMUT chip 402, this block would not have significant influence on the acoustics of the device and provides mechanical reference for positioning and/or handling. Expose edges of the backing block can make is easy to handle the assembly, e.g., to glue it into a housing of the probe 102.

The interconnection can be made in multiple directions in three-dimensional space. The single flexible printed circuit 404 electrically connects the row-column addressed CMUT chip to the communications interface 112 (FIG. 1), which, again, can be in the handle and/or elsewhere of the probe 102 (FIG. 1).

FIGS. 8-11 schematically illustrate an example in which the transducer array 108 includes a row-column addressed PZT chip 802.

This configuration is similar to the configuration discussed in connection with FIGS. 2-5 except the rows and columns are addressed from different and opposing sides 804 and 806 of the PZT chip 802, with one of the row or columns addressed through conductive strips on the (top) side 804 of the chip 802, which faces away from the single flexible printed circuit 404, and the other of the row or columns addressed through electrically conductive strips on the (bottom) side 806 of the chip 802, which faces the single flexible printed circuit 404.

Furthermore, unlike in the configuration discussed in connection with FIGS. 2-5, the traces 430 include sub-portions 808 that extend on the top side 406 and on a location under an installed row-column addressed PZT chip 802. With this embodiment, the electrically conductive strips on the bottom side 806 of the row-column addressed PZT chip 802 are bonded through an adhesive or the like to the sub-portions 808 of the traces 430, which electrically connects the rows or the columns to the single flexible printed circuit 404.

Figure 11:
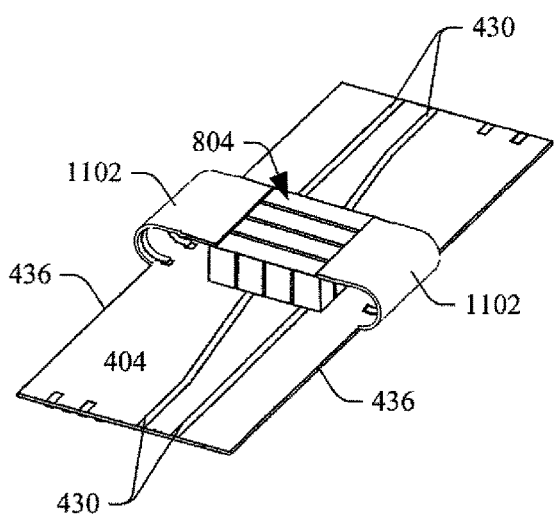

The other of the rows or the columns, which are addressed from the top side 804, are electrically connected the pads 426 with the discrete electrically conductive wires 442 like in FIGS. 2-5. In FIG. 11, the single flexible printed circuit 404 includes wings 1102, which extend or protrude out from sides 436 and 438 and that are configured to flex and curl around the top side 804 and electrically connect with the electrically conductive strips thereon through an adhesive. An acoustically-beneficial matching layer(s) can be applied to a remaining portion of the top side 804.

Organizing electrical connections (e.g., the traces 430 and 440) as described herein can facilitate assembly and/or enable ergonomics, e.g., by the use of only two legs of the flexible circuit (i.e., ends 432 and 434) that extend from opposite (non-adjacent) edges of the array. The single flexible printed circuit 404 connects to the active transducer material and employs a unique routing technique, which can minimize the number of circuit layers required to connect each row and column of the array. The single flexible printed circuit 404 is not configured for only the row-column addressed PZT chip 802.

In a variation, the signals are read out from only one side (e.g., the side 432 or the side 434), e.g., as discussed in connection with FIGS. 2-5. Likewise, in another variation, signals can be read out from adjacent sides 432 and 436 or 438, or 434 and 436 and/or 438, or signals can be read out from three or all four of the sides 432, 434, 436 and/or 438. Furthermore, in another variation, the interconnect 114 includes two or more flexible printed circuits and/or three or more metal layers. A backing block can be used as a mechanical function (as in the CMUT configuration) and an acoustical function (e.g., attenuating sound that is transmitted into it).

Figure 12:
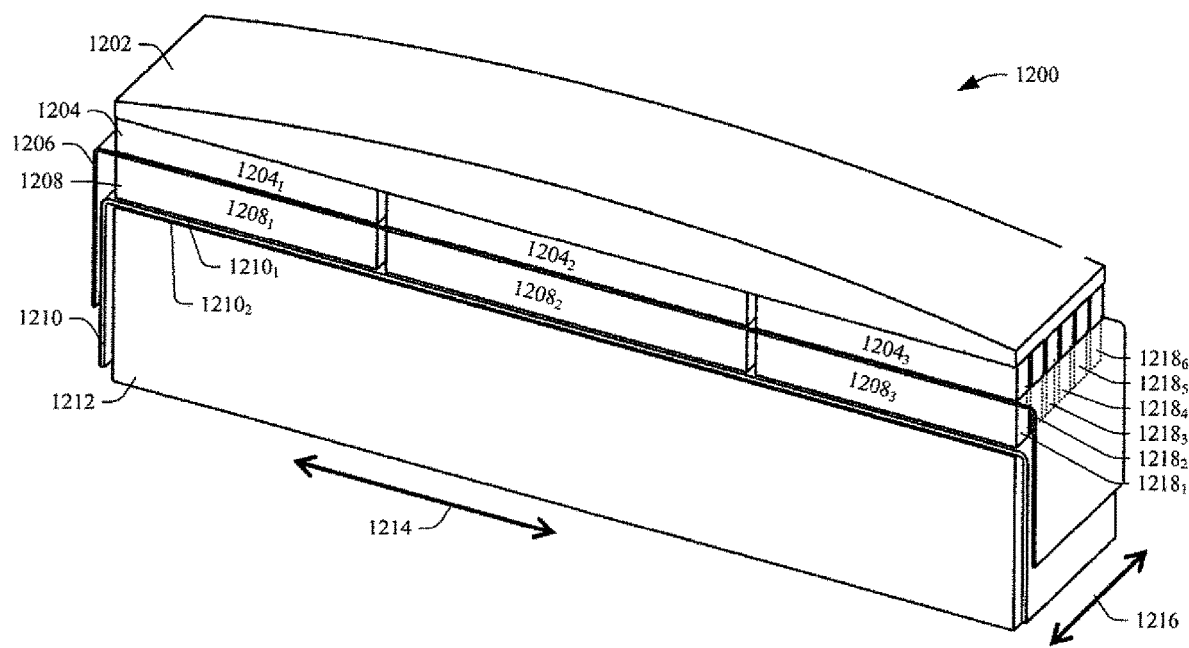
FIG. 12 schematically illustrates an example in which the transducer array is a multi-row transducer array.

FIG. 12 shows a perspective view of an example in which the transducer array 108 includes a multi-row transducer 1200 and the interconnect 114. It is to be appreciated that the interconnect 114 can be extended to other architectures such as a multi-layer ceramic as discussed in U.S. Pat. No. 6,971,148 to Mohr et al., layers with curved surfaces across elevation as discussed in U.S. Pat. No. 5,651,365 to Hanafy et al., or arrays with ground electrode that wraps around the edges of the ceramic instead of using a ground foil.

The multi-row transducer 1200 includes an acoustic lens 1202, an acoustic impedance matching layer(s) 1204, a ground foil 1206, an active layer 1208 (e.g., piezoelectric ceramic), the interconnect 114 which includes a flexible printed circuit 1210 with top and bottom layers 1210$_1$ and 1210$_2$, and a backing block 1212. The active layer 1208 includes three rows 1208$_1$, 1208$_2$ and 1208$_3$ in an elevation direction 1214, each row including a plurality of elements (not visible) in an azimuth direction 1216. Columns of elements 1218$_1$, 1218$_2$, 1218$_3$, 1218$_4$, 1218$_5$, and 1218$_6$ span the rows 1208$_1$, 1208$_2$ and 1208$_3$. Other embodiments include more or less rows and/or columns of elements.

Figure 13:
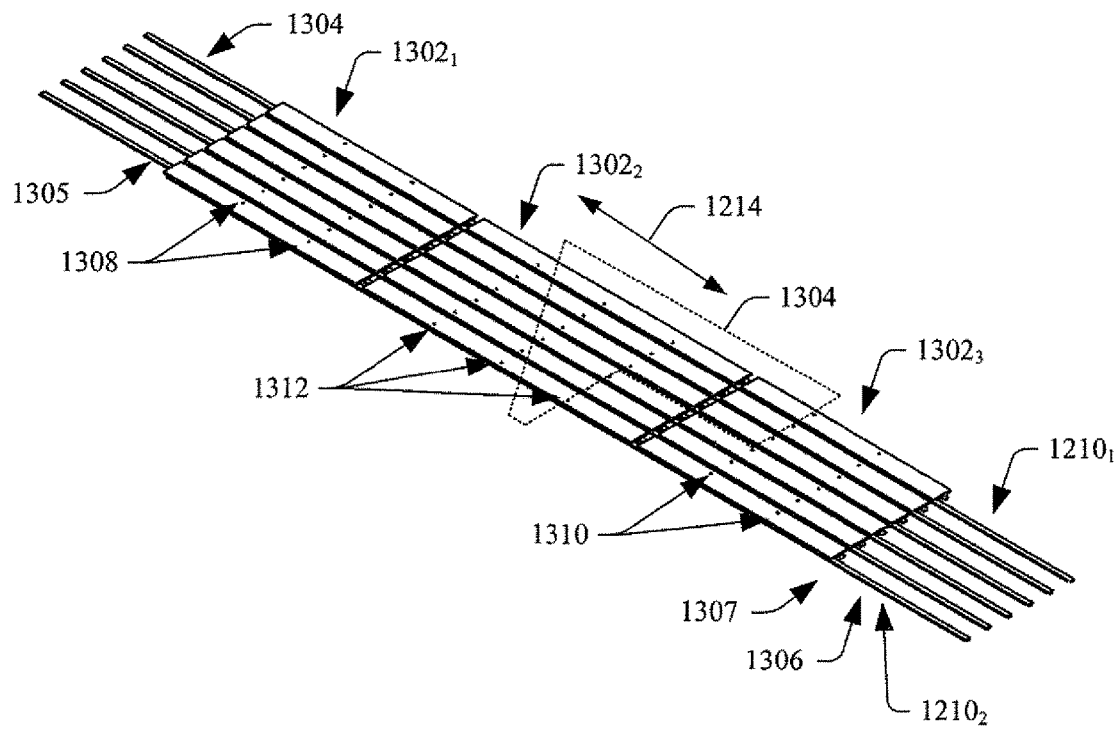
FIGS. 13 and 14 schematically illustrate an example in which the interconnect for the multi-row transducer array reads signals from an inner row of elements out from one side of the interconnect and combines and reads signals from two outer rows of elements out from an opposing side of the interconnect.

FIG. 13 schematically illustrates pad placement and trace routing of the flexible printed circuit 1210 for the configuration of FIG. 12. The top layer 1210$_1$ of the flexible printed circuit 1210 includes sets of pads 1302$_1$, 1302$_2$ and 1302$_3$, one set respectively for each of the elements of each of the rows 1208$_1$, 1208$_2$ and 1208$_3$. The bottom layer 1210$_2$ of the flexible printed circuit 1210 includes a first set of traces 1306 at one end 1307 and electrically connected to the pads 1302$_2$ for the middle row 1208$_2$ (FIG. 12), and a second set of traces 1304 at an opposing end 1305 and electrically connected to both the pads 1302$_1$ and 1302$_3$ for the two outer rows 1208$_1$ and 1208$_3$ (FIG. 12).

Figure 14:
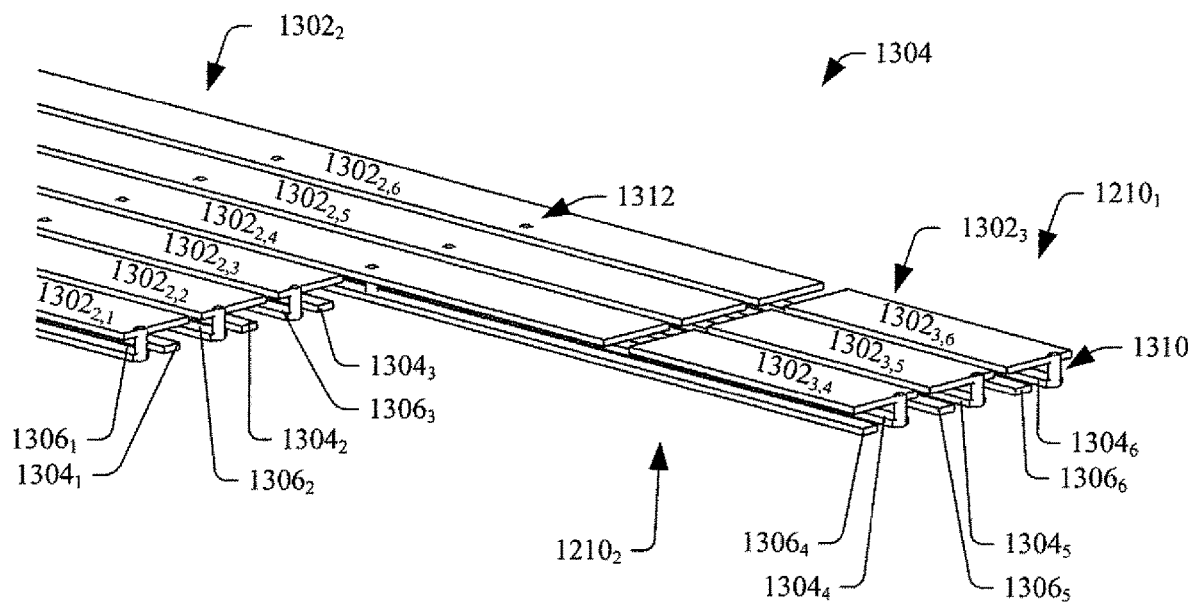

FIG. 14 shows a magnified view of traces 1304 of FIG. 13. A pair of traces 1304$_6$ and 1306$_6$ runs parallel to each other and under pads 1302$_{3,6}$ and 1302$_{2,6}$, a pair of traces 1304$_5$ and 1306$_5$ runs parallel to each other and under pads 1302$_{3,5}$ and 1302$_{2,5}$, a pair of traces 1304$_4$ and 1306$_4$ runs parallel to each other and under pads 1302$_{3,4}$ and 1302$_{2,4}$, a pair of traces 1304$_3$ and 1306$_3$ runs parallel to each other and under pad 1302$_{2,3}$, a pair of traces 1304$_2$ and 1306$_2$ runs parallel to each other and under pad 1302$_{2,2}$, and a pair of traces 1304$_1$ and 1306$_1$ runs parallel to each other and under pad 1302$_{2,1}$.

With reference to FIGS. 13 and 14, vias 1308 connect the pads 1302$_1$ for the outer row 1208$_1$ (FIG. 12) to the traces 1304, and vias 1310 connect the pads 1302$_3$ (e.g., the pads 1302$_{3,6}$, 1302$_{3,4}$, and 1302$_{3,5}$) for the other outer row 1208$_3$ (FIG. 12) to the same traces 1304 (e.g., the traces 1304$_6$, 1304$_5$ and 1304$_3$ in FIG. 14). This configuration electrically connects the elements of the two outer rows 1208$_1$ and 1208$_3$. Vias 1312 connect the pads 1302$_2$ (e.g., the pads 1302$_{2,1}$-1302$_{2,6}$ in FIG. 14) for the middle row 1208$_2$ (FIG. 12) to the traces 1306 (e.g., the traces 1306$_1$-1306$_6$).

This configuration represents symmetric row connections. For this configuration, a pitch of the traces 1304 and 1306 are less than half a pitch of the pads 1302 in order to fit pairs of the traces 1304 and 1306 side-by-side under each pad of the pads 1302 and hence under each of the transducer elements. In one instance, current state of the art approaches can be used for low-frequency and/or large pitch designs that are used for deep imaging on obese patients. Other approaches are also contemplated herein.

Figure 15:
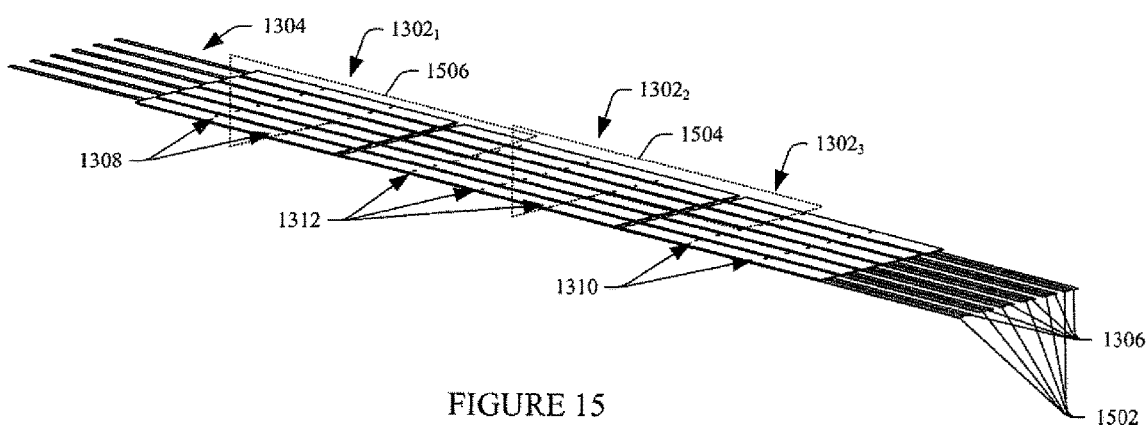
FIGS. 15, 16 and 17 schematically illustrate an example in which the interconnect for the multi-row transducer array reads signals from an inner row of elements out from one side of the interconnect and independently reads signals from two outer rows of elements out from an opposing side of the interconnect.

FIG. 15 shows a variation of the configuration of FIG. 14 in which the two outer rows 1208$_1$ and 1208$_3$ are not electrically connected to the same traces. As described above, the vias 1308 connect the pads 1302$_1$ for the outer row 1208$_1$ (FIG. 12) to the traces 1304. However, in this variation, the vias 1310 connect the pads 1302$_3$ for the other outer row 1208$_3$ (FIG. 12) to traces 1502. With this variation, each row can be electrically controlled completely independent of its mirror row. This enables increased control over the elevation focus characteristics, allowing steering in elevation.

Figure 16:
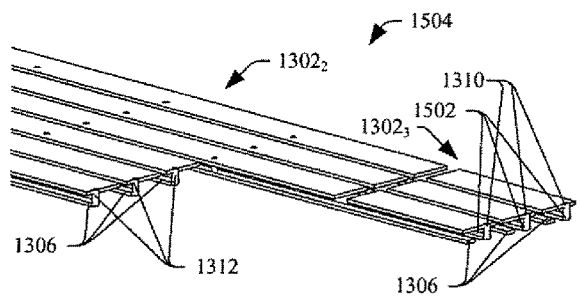
Figure 17:
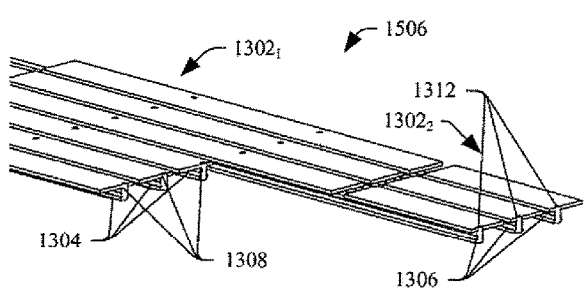

FIG. 16 shows a magnified view of a sub-section 1504 of FIG. 15. A pair of traces 1502 and 1306 runs parallel to each other and under pads 1302$_3$ with vias 1310 electrically connecting the pads 1302$_3$ and the traces 1502. The traces 1306 also run under pads 1302$_2$ with vias 1312 electrically connecting the pads 1302$_2$ and the traces 1306. FIG. 17 shows a magnified view of a sub-section 1506 of FIG. 15. The traces 1306 run and under pads 1302$_2$ with vias 1312 electrically connecting the pads 1302$_2$ and the traces 1306, and the traces 1304 run under pads 1302$_1$ with vias 1308 electrically connecting the pads 1302$_1$ and the traces 1304.

Figure 18:
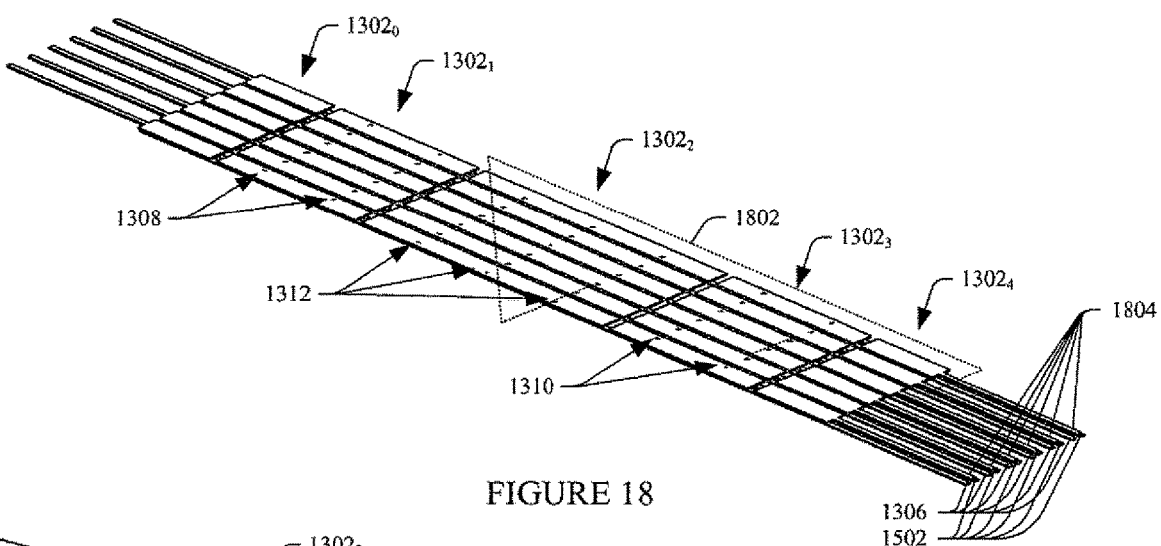
FIGS. 18 and 19 schematically illustrate an example in which the interconnect for the multi-row transducer array independently reads signals from two rows of elements out from one side of the interconnect and independently reads signals from three rows of elements out from an opposing side of the interconnect.

FIG. 18 shows variation of the flexible printed circuit 1210 of FIG. 12 for a configuration in which the active layer 1208 includes five rows of elements, including the rows $1208_1$-$1208_3$ discussed above (FIG. 12) and two additional rows which are located outside of the rows $1208_1$ and $1208_3$ respectively sandwiching them between rows $1208_0$ and $1208_2$ and between rows $1208_2$ and $1208_4$. In this instance, the flexible printed circuit 1210 includes two additional sets of pads $1302_0$ and $1302_4$ respectively for the two additional rows of elements.

Figure 19:
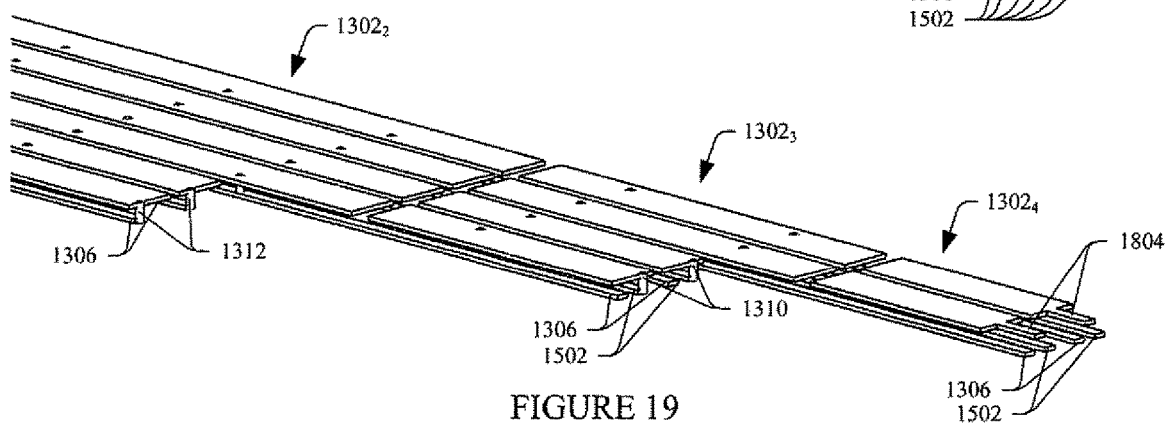

FIG. 19 shows a magnified view of a sub-section 1802 of FIG. 18. For this configuration, the traces 1306 run under the pads $1302_2$ with the vias 1312 electrically connecting the pads $1302_2$ and the traces 1306, and the pair of traces 1502 and 1306 runs parallel to each other and under the pads $1302_3$ and $1302_4$ with the vias 1310 electrically connecting the pads $1302_3$ and the traces 1502 and the vias 1312 electrically connecting the pads $1302_2$ and the traces 1306. The pads $1302_4$ include extensions 1804 configured as traces for the pads $1302_4$.

For the configurations of FIGS. 12-19, the interconnect 114 (i.e., the single flexible printed circuit 1210) makes electrical interconnect with the active layer by discrete conductive pads on its adjacent surface. These pads contain vias to connect to the opposite surface of the single flexible printed circuit 1210 where the majority of the signal traces run. Signal traces run in parallel on the opposite surface to make optimal use of azimuthal space under the element. This allows for the single flexible printed circuit 1210 to include only a minimum number of layers (e.g., two metal layers), which minimizes acoustic impact.

Using the two-layer single flexible printed circuit 1210 bonded in a planar configuration, sandwiched between the active layer 1208 and the backing 1212, keeps the backing fabrication and electrical connection processes simple, e.g., as opposed to embedding the interconnect into the backing or attaching wires to individual elements. For a larger number of rows, some traces can be run on the top surface (no via required), and/or the number of flex layers could be increased. Even if the number of layers is increased, the approach described herein still helps minimize the number of required layers.

Figure 20:
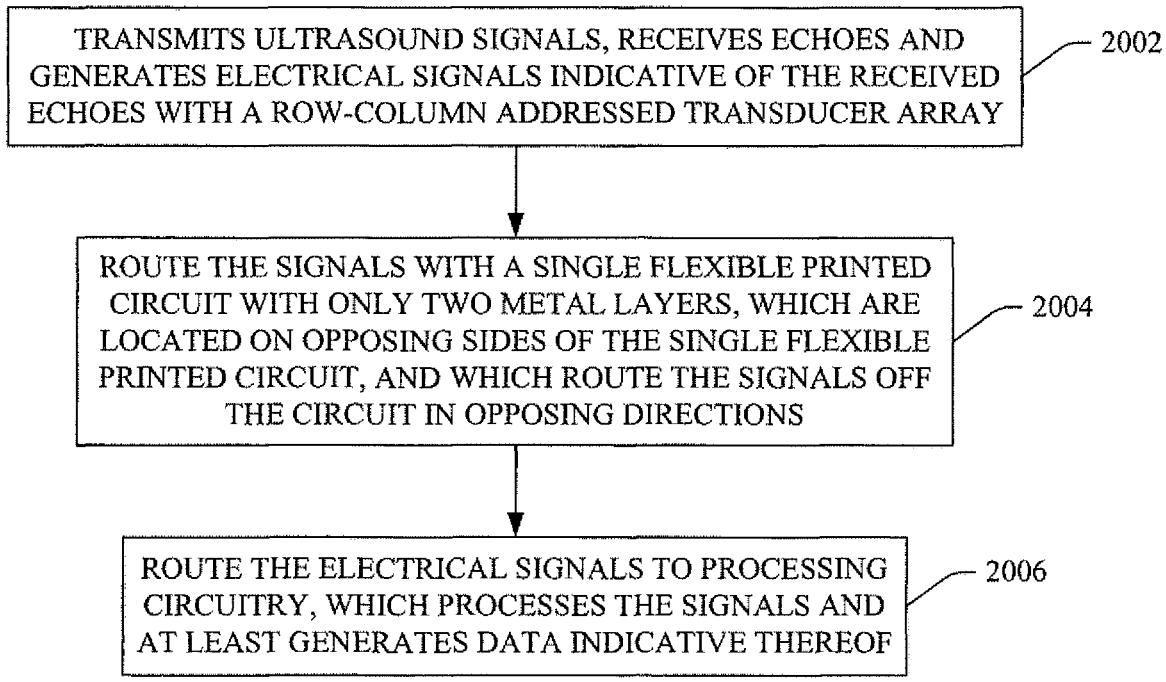
FIG. 20 schematically illustrates an example method for a row-column addressed CMUT or PZT based transducer array.
Figure 21:
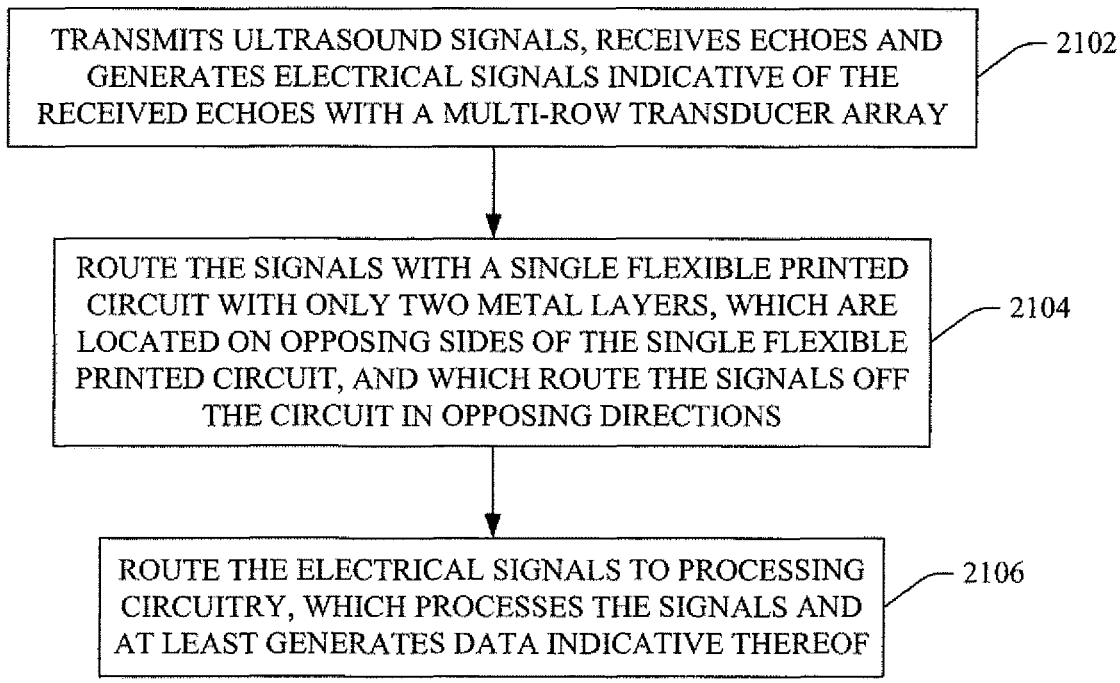
FIG. 21 schematically illustrates an example method for a row-column addressed multi-row transducer array.

FIGS. 20 and 21 illustrate methods in accordance with one or more embodiments disclosed herein.

It is to be appreciated that the order of the following acts is provided for explanatory purposes and is not limiting. As such, one or more of the following acts may occur in a different order. Furthermore, one or more of the following acts may be omitted and/or one or more additional acts may be added.

FIG. 20 illustrates a method for a row-column addressed CMUT or PZT transducer array.

At 2002, a row-column addressed transducer array transmits ultrasound signals, receives echoes, and generates electrical signals indicative of the received echoes.

At 2004, the electrical signals are routed from the transducer array to a communications interface through the interconnect 114, which, in one instance, is a single flexible printed circuit with only two metal layers, which are located on opposing sides of the single flexible printed circuit, and which route the signals off the interconnect 114 in opposing directions.

At 2006, the electrical signals are further routed to processing circuitry, which processes the signals and at least generates data indicative thereof (e.g., an image).

FIG. 21 illustrates a method for a multi-row transducer array.

At 2102, a multi-row transducer array transmits ultrasound signals, receives echoes, and generates electrical signals indicative of the received echoes.

At 2104, the electrical signals are routed from the transducer array to a communications interface through the interconnect 114, which, in one instance, is a single flexible printed circuit with only two metal layers, which are located on opposing sides of the single flexible printed circuit, and which route the signals off the interconnect 114 in opposing directions.

At 2106, the electrical signals are further routed to processing circuitry, which processes the signals and at least generates data indicative thereof (e.g., an image).

The application has been described with reference to various embodiments. Modifications and alterations will occur to others upon reading the application. It is intended that the invention be construed as including all such modifications and alterations, including insofar as they come within the scope of the appended claims and the equivalents thereof.

What is claimed is:

1. An apparatus, comprising:
   a probe, including:
      a transducer array with a plurality of elements;
      a communications interface; and
      an interconnect configured to route electrical signals between the plurality of elements and the communications interface, wherein the interconnect includes:
         a flexible printed circuit, including:
            a top having a first surface with a first metal layer;
            a bottom having a second opposing surface, which opposes the first surface, with a second metal layer;
            a first end;
            a second opposing end;
            a middle region of the top configured to receive the transducer array wherein the middle region has a first side and a second side that opposes the first side;
            a first section that protrudes from the first side and extends to the first end, wherein the first section extends from the top and wraps around the first side and the bottom; and
            a second region that protrudes from the second side and extends to the second end, wherein the second section extends from the top and wraps around the second side and the bottom; and
            traces configured to readout signals from at least one of the first and second opposing ends.

2. The apparatus of claim 1, wherein the traces readout signals from both of the first end and the second opposing end.

3. The apparatus of claim 1, wherein the traces readout signals from only one the first end or the second opposing end.

4. The apparatus of claim 1, wherein the flexible printed circuit includes a single flexible printed circuit with only the first and the second metal layers.

5. The apparatus of claim 1, wherein a first sub-set of the traces are disposed in the first metal layer and a second sub-set of the traces are disposed in the second metal layer.

6. The apparatus of claim 5, wherein the transducer array includes a capacitive micromachined ultrasonic transducer array with row and column electrodes on a top surface of the transducer array, wherein the electrodes face away from the single flexible printed circuit in an opposing direction, and wires electrically connect the electrodes to the traces.

7. The apparatus of claim 6, wherein the first metal layer includes pads, the second metal layer includes a sub-set of the traces, and vias electrically connect the pads and the sub-set of the traces, and a sub-set of the wires electrically connects a sub-set of the electrodes to the second sub-set of the traces through the pads.

8. The apparatus of claim 5, wherein a first sub-portion of the single flexible printed circuit includes the traces and is located under a second sub-portion of the single flexible printed circuit that includes no traces, and the transducer array is coupled to the second sub-portion.

9. The apparatus of claim 5, wherein the transducer array includes a piezoelectric transducer array with row electrically conductive strips on a top of the transducer array and column conductive strips on a bottom of the transducer array, the top of the transducer array faces away from the single flexible printed circuit in an opposing direction, and the bottom of the transducer array faces the single flexible printed circuit.

10. The apparatus of claim 9, wherein the first metal layer of the single flexible printed circuit includes pads, the second metal layer of the single flexible printed circuit includes a sub-set of the traces, and vias electrically connect the pads and the sub-set of the traces.

11. The apparatus of claim 10, wherein wires electrically connect the electrically conductive strips on the top of the transducer array to the pads.

12. The apparatus of claim 11, wherein the first metal layer of the single flexible printed circuit includes electrically conductive strips, and the electrically conductive strips on the bottom of the transducer array are electrically connected to the electrically conductive strips the first metal layer of the single flexible printed circuit, and the electrically conductive strips the first metal layer are electrically connected to traces in the first metal layer.

13. The apparatus of claim 1, wherein the transducer array includes a multi-row transducer array, wherein the rows are along an elevation direction, and each row includes a plurality of elements along an azimuth direction.

14. The apparatus of claim 13, wherein the traces are disposed only in the second metal layer, and pads are disposed only in the first metal layer.

15. The apparatus of claim 13, wherein the traces are disposed in both the first metal layer and the second metal layer.

16. The apparatus of claim 13, wherein a pad disposed in the first metal layer includes a trace.

17. The apparatus of claim 13, wherein each of the rows is electrically connected to a different sub-set of the traces.

18. The apparatus of claim 13, wherein at least two of the rows are electrically connected to a same sub-set of the traces.

* * * * *